United States Patent [19]

Yeh et al.

[11] Patent Number: 4,818,719

[45] Date of Patent: Apr. 4, 1989

[54] METHOD OF MANUFACTURING AN INTEGRATED CMOS OF ORDINARY LOGIC CIRCUIT AND OF HIGH VOLTAGE MOS CIRCUIT

[75] Inventors: Ching-Fa Yeh; Yasunao Misawa; Yuji Yatsuda, all of Kanagawa, Japan

[73] Assignee: Fuji Xerox Co., Ltd., Japan

[21] Appl. No.: 74,059

[22] Filed: Jul. 16, 1987

[30] Foreign Application Priority Data

Jul. 24, 1986 [JP] Japan .................................. 61-174030

[51] Int. Cl.$^4$ ......................................... H01L 21/265
[52] U.S. Cl. ..................................... 437/057; 357/42; 437/34; 437/46; 437/56; 437/59
[58] Field of Search ........................ 437/34, 56, 59, 46, 437/57; 357/42

[56] References Cited

U.S. PATENT DOCUMENTS

| | | | |
|---|---|---|---|
| 4,285,116 | 8/1981 | Meguro | 437/34 |
| 4,333,225 | 6/1982 | Yeh | 437/29 |
| 4,426,766 | 1/1984 | Lee | 437/34 |
| 4,550,490 | 11/1985 | Blossfeld | 437/29 |
| 4,696,092 | 9/1987 | Doering et al. | 437/34 |

OTHER PUBLICATIONS

Martin et al, IEDM, 1984, pp. 266–269.

*Primary Examiner*—Upendra Roy
*Attorney, Agent, or Firm*—Gerald J. Ferguson, Jr.

[57] ABSTRACT

A method of manufacturing a semiconductor device having a high voltage CMOS unit for an ordinary logic operation and a MOS unit which are provided in a single semiconductor substrate of a first conduction type. The method includes the steps of performing an element region making process for making a well of a second conduction type in the substrate, performing a process for providing field-effect transistors having channels of mutually different conduction types in the substrate and the well, and then performing a process for providing electrode wiring layers. Finally, a process is performed for providing a first impurity region having a particular conduction type and serving as a channel stopper of the CMOS unit and a second impurity region having the conduction type of the first impurity region and serving as an offset low-resistance layer of the high voltage MOS unit.

7 Claims, 5 Drawing Sheets

METHOD OF MANUFACTURING AN INTEGRATED CMOS OF ORDINARY LOGIC CIRCUIT AND OF HIGH VOLTAGE MOS CIRCUIT

BACKGROUND OF THE INVENTION

1. Field of the Invention

The present invention relates to a method of manufacturing a semiconductor device, and particularly, a method which simplifies the processes by which a CMOS (complementary) metal-oxide semiconductor) unit for an ordinary logic circuit and a CMOS unit of a high dielectric strength are manufactured in the same substrate.

2. Description of the Prior Art and Problems Therewith

The high integration of a high voltage semiconductor device has been advancing along with the progress of semiconductor technology. Large-scale integrated circuits, in which a CMOS unit for an ordinary logic circuit and a CMOS unit are provided together in the same substrate, have recently been developed.

When the field-effect transistor (FET) of a high voltage CMOS unit is to be manufactured, the construction of the unit and the method of manufacturing the unit are determined upon consideration of the following problems:

(1) punch-through phenomenon between the source and the drain, in which a depletion layer extends to the source region if the length of the channel is small;

(2) dielectric breakdown between the gate and the drain; and (3) avalanche caused by the concentration of an electric field near the surface of the drain region which occurs when the drain region and the gate are overlaid with an interposed thin insulator film.

In order to solve the above-mentioned problems, the procedures described below have been adopted:

(1) with respect to the punch-through phenomenon, the gate is provided in common thereto to increase the channel length;

(2) with respect to the dielectric breakdown, the thickness of the insulator film (as shown at 111 in FIG. 3(a)) at the place of the dielectric breakdown is increased or the distance between the gate (as shown in 112 FIG. 3(a)) and the drain (as shown at 113 in FIG. 3(a)) is sufficiently large so as to weaken the electric field between the gate and the drain; and (3) with respect to the avalanche, an offset gate structure is provided to weaken the electric field, or an insulator film is provided on the structure to make a stacked gate (as shown in 112a in FIG. 3(b)) to control the electric field.

In another procedure, an impurity is diffused at a low concentration to provide a low-concentration layer (as shown at 113a in FIG. 3(c)) of the same type as the drain region (as shown at 113 in FIG. 3(c)) to provide a channel region as an offset region. A field plate (as shown at 115 in FIG. 3(c)) is provided by extending the drain (as shown at 123 in FIG. 3(c)) toward the source, to reduce the concentration of the electric field at the conjoined end of the drain. However, if the field plate is extended as the thickness of the gate insulator film remains fixed, high voltage is likely to act on the film to cause electrostatic breakdown. On the other hand, if the thickness of the gate insulator film is increased, the original effect of the field plate, to reduce the concentration of the electric field at the conjoined end, is diminished. For that reason, there is a limit to the effectiveness of improving the dielectric strength by modifying the field plate.

Still another procedure has been considered effective in which a low-concentration impurity layer is provided around a high-concentration impurity region as a source-drain region and a field plate is provided to reduce the concentration of the electric field at the conjoined end to improve the dielectric strength. However, this construction is complicated, and diffusion must be performed two times.

When such a construction is adopted for a high voltage MOSFET (metal-oxide semiconductor field-effect transistor), particularly, when the high voltage CMOS unit and the CMOS unit for an ordinary logic circuit are integrated in a single substrate, a large number of processes are needed.

For example, when a p-type well is made in an n-type silicon substrate to provide a high voltage CMOS unit and a CMOS unit for an ordinary logic operation, a $p^-$-type high voltage layer is used as the offset low-resistance layer of a p-type MOSFET. On the other hand, another $p^-$-type layer is used as the channel stopper of an n-type MOSFET for an ordinary logic operation, which is provided in the p-type well.

An $n^-$-type layer is used as the offset low-resistance layer of a high-voltage n-type MOSFET manufactured in the p-type well, while another $n^-$-type layer is used as the channel stopper of a p-type MOSFET for an ordinary logic operation, which is manufactured in the n-type silicon substrate.

It will be understood from the above description that there are many section, in each of which a CMOS unit for an ordinary logic operation and a high voltage CMOS unit have the same construction although they perform different functions, as shown in TABLE I below.

TABLE I

| Device Function Construction | Ordinary logic CMOS | High-Voltage CMOS |
|---|---|---|
| 1. $N^-$-type injection layer $P^-$-layer | (1) Only used as channel stopper | (1) Used as channel stopper under ring gate provided around (2) Used as offset low-resistance layer |
| 2. LOCOS Insulator film | (1) Used as element separation film | (1) Used as element separation film (2) Used as thick insulator film between gate and drain |
| 3. High concentration $n^+$-type and $p^+$-type injection layers based on self- | (1) Formation of source | (1) Formation of source and drain layers (Formation of low-concentration $n^-$-type and |

TABLE I-continued

| Device Function Construction | Ordinary logic CMOS | High-Voltage CMOS |
| --- | --- | --- |
| alignment of gate | | $p^-$-type injection layers of large diffusion coefficient and same conduction type) |
| 4. Aluminum electrode | (1) Used as source and electrodes | (1) Used as source and drain electrodes<br>(2) Used as field plate |

In the above-described conventional procedures, the various regions are made separately. For this reason, the processes for manufacturing these units are complicated and large amounts of time are required to perform the manufacturing processes.

The present invention was made in consideration of the above-described circumstances. Accordingly, it is an object of the present invention to simplify the processes for manufacturing a high voltage semiconductor device which includes both a MOS unit and a CMOS unit for an ordinary logic operation.

SUMMARY OF THE INVENTION

According to the present invention, an impurity region, which has a conduction type and serves as the channel stopper of a CMOS unit for an ordinary logic operation, and an impurity region, which has the same conduction type and serves as the offset low-resistance layer of a MOS unit having a high dielectric strength, the semiconductor device having both the CMOS unit and the MOS unit is manufactured.

BRIEF DESCRIPTION OF THE DRAWINGS

The invention will now be described in greater detail with reference to the embodiments illustrated in the accompanying drawings, given solely by way of example, in which.

DETAILED DESCRIPTION OF THE INVENTION

Figure 1:
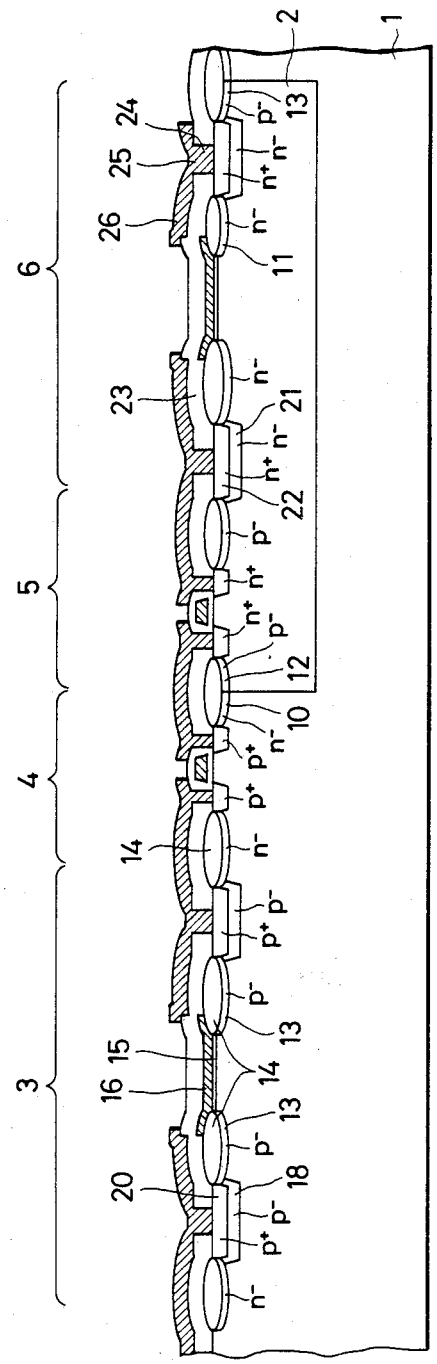
FIG. 1 shows the construction of an integrated semiconductor device manufactured in a method which is an embodiment of the present invention.
Figure 3A:
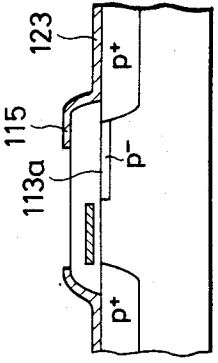
FIGS. 3(a), 3(b) and 3(c) show the construction of a semiconductor unit of a high sustaining breakdown voltage.
Figure 3B:
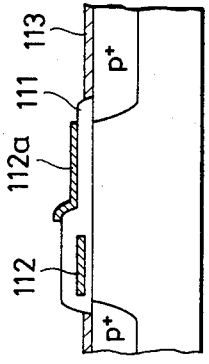
Figure 3C:
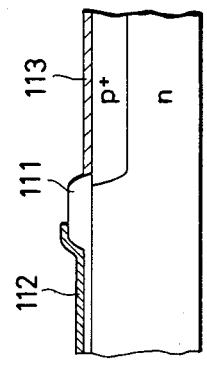

Since the sustaining breakdown voltage of a MOSFET greatly depends on the concentration of the impurity in the offset low-resistance layer mentioned above, conventionally, a CMOS unit and a MOS unit have been manufactured while the impurity concentration is controlled.

Preferably the thick insulator film necessary to achieve such a high sustaining breakdown voltage mentioned above has conventionally been made at the same time as a LOCOS process in which a field oxidation film for separating elements from one another is performed.

Further, conventional processes involve the provision of a field plate and the implantation of an impurity, having a large diffusion coefficient and a conduction type, at a low concentration at the same time as the implantation of an impurity having the same conduction type, in order to achieve the high sustaining breakdown voltage.

According to the present invention, in contrast with the conventional procedures, the offset low-resistance layer and the channel stopper, which have the same conduction type, are provided in the identical process. For that reason, the minimum number of photomasks necessary is reduced by half, from four to two, so that the manufacturing processes are greatly simplified. If the concentration of the offset low-resistance layer is different from that of the region having the maximum sustaining breakdown voltage, the offset length is increased by an amount equal to the difference so as to prevent decreasing of the sustaining breakdown voltage.

The following elements are illustrated in the drawings: n-type silicon substrate 1, p-type well 2, p-type high-voltage MOSFET 3, n-type high-voltage MOSFET 4, n-type MOSFET 5 for an ordinary logic operation, p-type MOSFET 6 for an ordinary logic operation, silicon oxide film 7, silicon nitride film 8, resist pattern 9, $n^-$-type channel stopper layer 10, $n^-$-type offset low resistance layer 11, $p^-$-type changed stopper layer 12, $p^-$-type offset low-resistance layer 13, field oxidation film 14, gate oxidation film 15, gate electrode 16, resist pattern 17, $p^-$-type diffusion layer 18, resist pattern 19, $p^+$-type diffusion layer 20, $n^-$-type diffusion layer 21, $n^+$-type diffusion layer 22, inter-layer insulator film 23, contact hole 24, source-drain electrode 25, field plate electrode 26, insulator film 111, gate 112, drain 113, stacked gate 112a, low-concentration layer 113a, drain 123, and field plate 115.

An embodiment of the present invention, which is a method of manufacturing an integrated semiconductor device, is hereafter described in detail with reference the drawings.

FIG. 1 shows the integrated semiconductor device manufactured according to the method of the present invention. In the device, a p-type well 2 is provided in an n-type silicon substrate 1. The device includes a high voltage p-type MOSFET 3 having a and provided at the surface of the substrate 1. A p-type MOSFET 4 for an ordinary logic operation is also provided at the surface of the substrate. An n-type MOSFET 5 for an high voltage ordinary logic operation and an n-type MOSFET 6 are provided in the well 2.

Figure 2A:
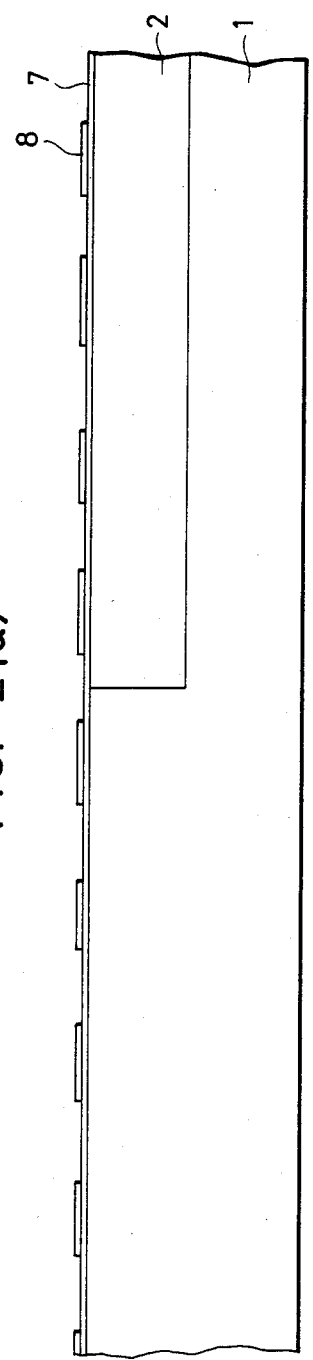
FIGS. 2(a), 2(b), 2(c), 2(d), 2(e) and 2(f) show processes for manufacturing the device.

After the p-type well 2 is provided in the n-type silicon substrate 1, a thin silicon oxide (SiO$_2$) film 7 is made on the surface of the substrate and a silicon nitride (Si$_3$N$_4$) film 8 is then made on the film 7, as shown in FIG. 2(a). The silicon nitride film 8 is then selectively removed by photolithography in the places where field oxidation films 14 are to be made.

Figure 2B:
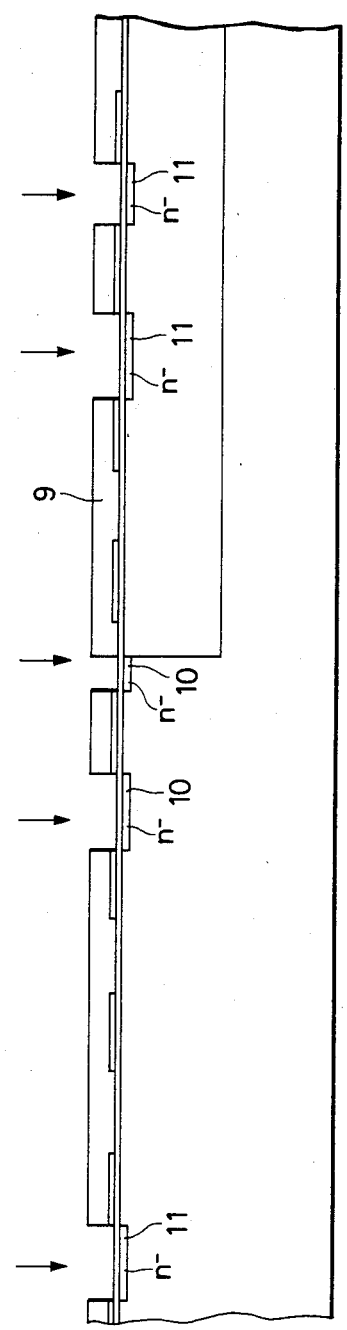

Subsequently, a resist pattern 9 is made, as shown in FIG. 2(b). Phosphorus (P) ions are implanted by an ion implanted procedure so that the $n^-$-type channel stopper 10 of the p-type MOSFET 4 for ordinary logic operation and the $n^-$-type offset low resistance layer 11 of the high voltage n-type MOSFET 6 are simultaneously provided.

Figure 2C:
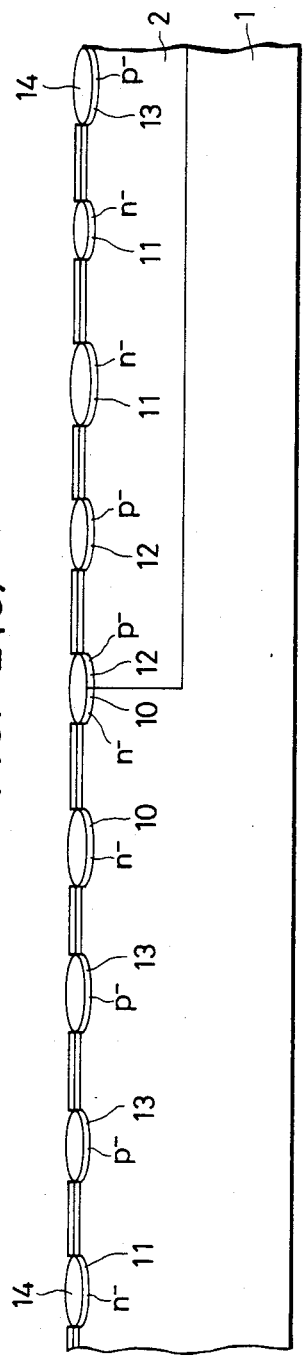
Figure 2D:
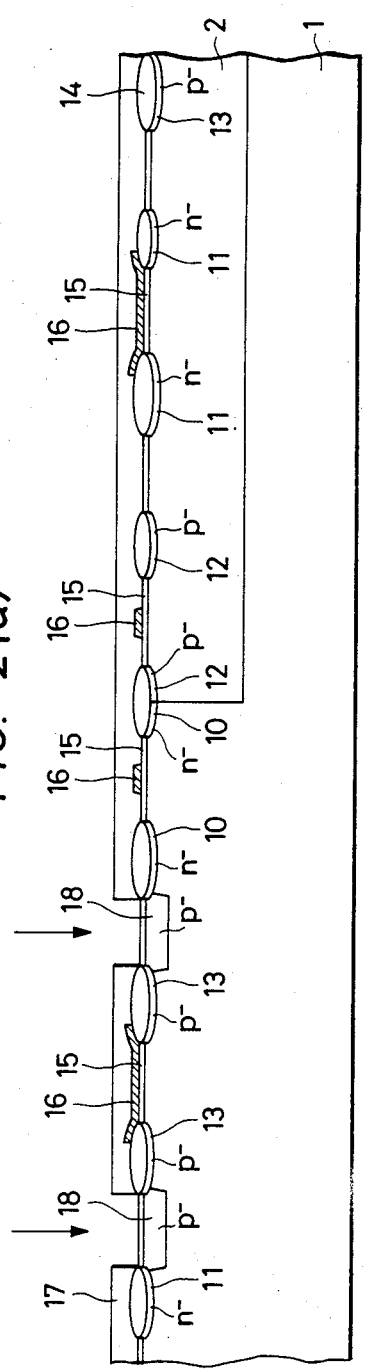

Subsequently, the resist pattern 9 is removed. Another resist pattern is then made. Boron (B) ions are injected by an ion implantation procedure so that the p⁻-type channel stopper layer 12 of the n-type MOSFET 5 for an ordinary logic operation and the p⁻-type offset low-resistance layer 13 of the high voltage p-type MOSFET 3 are simultaneously provided. The resist pattern is then removed. Field oxidation is performed by a LOCOS procedure while the silicon nitride films 8 are used as masks, so that the thick field oxidation films 14 are made, as shown in FIG. 2(c).

The silicon nitride films 8 are then removed and gate oxidation films 15 and gate electrodes 16 are provided by a conventional procedure. The gate electrodes 16 are made of polysilicon layers doped with phosphorus at a high concentration.

A resist pattern 17 having openings only for the high voltage p-type MOSFET 3 is made. Boron (B) ions are implanted with self-alignment by using the gate electrodes 16 and the field oxidation films 14 as masks, so that p⁻-type deep low-concentration diffusion layers 18 are provided.

Figure 2E:
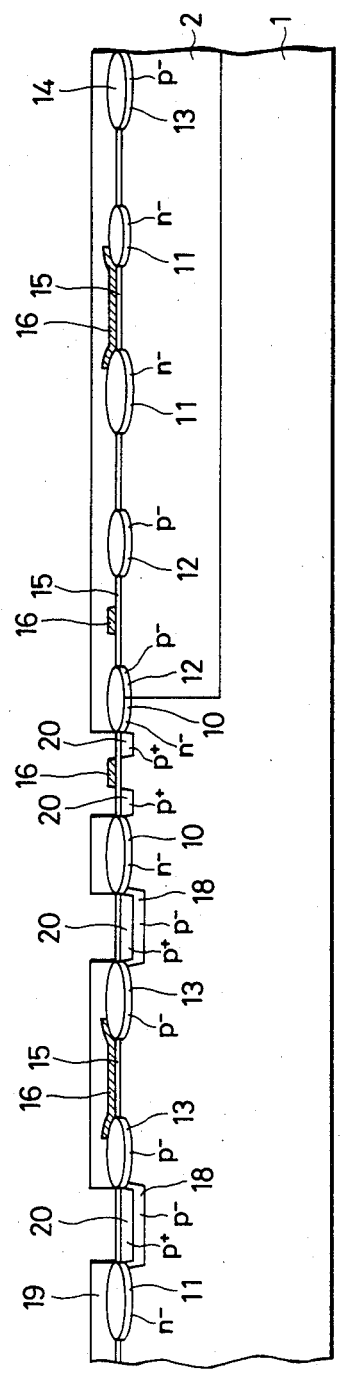

Subsequently, a resist pattern 19 having openings only for the surfaces of the p-type MOSFET 4 for an ordinary logic operation and the high voltage p⁻-type MOSFET 3 is made, as shown in FIG. 2(e). Boron bifluoride ions (BF$_2$⁺) are implanted with self-alignment so that p⁺-type diffusion layers 20 are provided as source and drain regions.

Figure 2F:
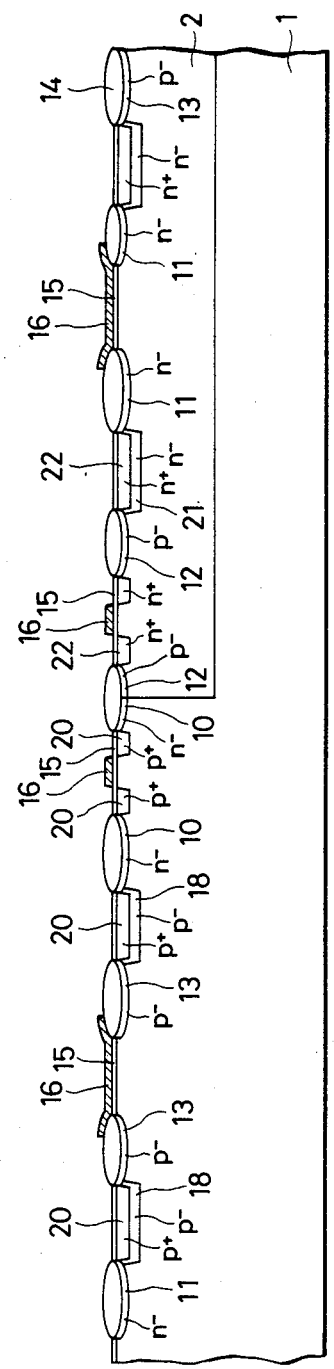

N⁻-type diffusion layers 21 and n⁺-type diffusion layers 22 are then sequentially provided, as shown in FIG. 2(f), so that the layers 22 serve as source and drain regions.

A BPSG film 23 is then formed as an inter-layer insulation film shown in FIG. 1. The surface of the film 23 is smoothed by a reflow procedure. Contact holes 24 for connection to the source and drain regions are made in the film 23. Source and drain electrodes 25 are thereafter made of aluminum layers. At that time, the electrodes 25 which are in contact with the drains are extended toward gates so that the electrodes serve as field plate electrodes 26.

Finally, a passivation film (not shown in the drawings) and so forth are provided. The integrated semiconductor device shown in FIG. 1 is thus completed.

According to the method described above, the ion implantation process is simplified so that the number of photolithographic processes for the ion implantation process is reduced, thereby facilitating the manufacturing of the integrated semiconductor device. The number of processing steps is reduced further because the thick insulator films 14 for achieving the high sustaining breakdown voltage are made at the same time as the LOCOS process for separating elements from each other.

Although a CMOS unit for an ordinary logic operation and a high voltage CMOS unit are provided together in the same substrate in the above-described embodiment, the present invention can be also applied to the case in which a unit of a high sustaining breakdown voltage is made of only a p-type or n-type MOS element.

The present invention is also not confined to the above-described embodiment with respect to the impurities. In the ion implantation process for making the deep low-concentration diffusion layer and in the ion implantation process for making the high-concentration diffusion layer, it is preferable to adjust the depth of diffusion by making the acceration voltage high or by selecting an impurity having a larger coefficient in the former process.

If the sustaining breakdown voltage is about several tens of volts, the n⁻-type diffusion layers and p⁻-type diffusion layers for the sources and drains of the high voltage CMOS unit may not be provided.

According to the present invention, the offset low-resistance layer of a high voltage MOS unit and the channel stopper layer having the same conduction type as the offset low-resistance layer and belonging to a CMOS unit for an ordinary logic operation are simultaneously provided, as described above. For that reason, processes for manufacturing the semiconductor device are greatly simplified so as to facilitate the manufacturing process.

Although the invention has been described with reference to particular means, methods, and embodiments, it is to be understood that the invention is not confined to the embodiment described in the foregoing and illustrated herein, but extends to all equivalents within the scope of the claims.

What is claimed is:

1. A method of manufacturing a semiconductor device having a CMOS unit for an ordinary logic operation and a high voltage MOS unit which are provided in a single semiconductor substrate of a first conduction type, said method comprising the steps of:
    forming a well of a second conduction type in said substrate;
    forming field-effect transistors having channels of mutually different conduction types in said substrate and said well;
    forming electrode wiring layers; and
    forming a first impurity region having a particular conduction type and serving as a channel stopper of said CMOS unit and a second impurity region having said particular conduction type of the first impurity region and serving as an offset low-resistance layer of said MOS unit;
    wherein in said step of forming first and second impurity regions, forming each of said first and second impurity regions substantially simultaneously in an identical process.

2. The method according to claim 1 wherein said element region process comprises the steps of:
    performing a LOCOS process for making an insulator film for separating elements from one another; and
    using a mask pattern having an opening between a source and a drain of said high voltage MOS unit to form a thick insulator film on a region between said source and drain simultaneously with the making of said insulator film for separating said elements from one another.

3. The method according to claim 1 wherein said element region process comprises the steps of:
    forming a deep low-concentration diffusion layer having a particular conduction type for said high voltage MOS unit; and
    performing an ion-implantation step for making source and drain regions having said particular conduction type of the diffusion layer.

4. The method according to claim 1 wherein said process for providing electrode wiring layers comprises the steps of:
    making a source-drain electrode pattern; and
    substantially simultaneously as said source-drain electrode pattern is made, extending the drain electrode of said high voltage MOS unit to a location right over the offset low-resistance layer.

5. The method according to claim 1 wherein said first and second impurity region forming step comprises the steps of:
   forming the first impurity region having a first conduction type and serving as a channel stopper of said CMOS unit formed in said substrate and the second impurity region having said first conduction type and serving as an offset low-resistance layer of said MOS unit formed in said well; and
   forming the first impurity region having a second conduction type and serving as a channel stopper of said CMOS unit formed in said well and the second impurity region having said second conduction type and serving as an offset low-resistance layer of said MOS unit formed in said substrate.

6. The method according to claim 2 wherein said element region process comprises the steps of:
   forming a deep low-concentration diffusion layer having a particular conduction type for said high voltage MOS unit; and
   performing an ion-implantation step for making source and drain regions having said particular conduction type of the diffusion layer.

7. The method according to claim 2 wherein said process for forming electrode wiring layers comprises the steps of:
   making a source-drain electrode pattern; and
   substantially simultaneously as said source-drain electrode pattern is made, extending the drain electrode of said high voltage MOS unit to a location right over the offset low-resistance layer.

* * * * *